United States Patent [19]
Sachdev

[11] Patent Number: 6,134,688
[45] Date of Patent: Oct. 17, 2000

[54] ELECTRONIC DEVICE SELECTABLY OPERABLE AS A SEQUENTIAL LOGIC CIRCUIT OR A COMBINATORIAL LOGIC CIRCUIT AND CIRCUIT TESTING METHOD

[75] Inventor: Manoj Sachdev, Eindhoven, Netherlands

[73] Assignee: U.S. Philips Corporation, New York, N.Y.

[21] Appl. No.: 09/551,153

[22] Filed: Nov. 26, 1997

Related U.S. Application Data

[63] Continuation of application No. 08/271,801, Jul. 7, 1994, abandoned.

[30] Foreign Application Priority Data

Jul. 9, 1993 [EP] European Pat. Off. .............. 93202027

[51] Int. Cl.[7] .................................................. G01R 31/28
[52] U.S. Cl. ......................... 714/727; 327/396; 327/401
[58] Field of Search .................................. 371/22.3, 22.5, 371/22.6, 22.1, 22.2; 327/365, 373, 396, 401; 714/727, 726, 733, 734, 724

[56] References Cited

U.S. PATENT DOCUMENTS

| | | | |
|---|---|---|---|
| 4,357,703 | 11/1982 | Van Brunt | 371/15 |
| 4,366,393 | 12/1982 | Kasuya | 307/221 |
| 4,424,581 | 1/1984 | Kawai | 365/154 |
| 4,855,669 | 8/1989 | Mahoney | 371/25 |
| 5,317,205 | 5/1994 | Sato | 371/22.3 |
| 5,396,498 | 3/1995 | Lestrat et al. | 371/22.5 |
| 5,425,034 | 6/1995 | Ozaki | 371/22.3 |
| 5,459,735 | 10/1995 | Narimatsu | 371/22.3 |
| 5,459,736 | 10/1995 | Nakamura | 371/22.3 |
| 5,533,032 | 7/1996 | Johnson | 371/22.5 |

OTHER PUBLICATIONS

"Current VS. Logic Testability of Bridges In Scan Chains" R. Rodriguez–Montanes et al, IEEE Proc. European Test Conf. Rotterdam, The Netherlands 1993, pp. 392–396.

PL22V10 In Philips Data Handbook IC13, Programmable Logic Devices (PLD) 1992, pp. 137–141.

*Primary Examiner*—Trinh L. Tu
*Attorney, Agent, or Firm*—Brian J. Wieghaus

[57] ABSTRACT

An electronic device, with a plurality of logic stages for functional collaboration, is provided with selection means for selectively operating the plurality of stages to form either a sequential logic circuit or a combinatorial logic circuit. This enables conversion of sequential logic circuitry into combinatorial logic circuitry for the purpose of effective $I_{DDQ}$-testing.

7 Claims, 6 Drawing Sheets

ELECTRONIC DEVICE SELECTABLY OPERABLE AS A SEQUENTIAL LOGIC CIRCUIT OR A COMBINATORIAL LOGIC CIRCUIT AND CIRCUIT TESTING METHOD

This is a continuation of application Ser. No. 08/271,801, filed Jul. 7, 1994 now abandoned.

FIELD OF THE INVENTION

The invention relates to an electronic device with a plurality of logic circuit stages for functional collaboration, and to a method of testing sequential logic circuitry.

BACKGROUND OF THE INVENTION

To appreciate the invention, this section gives some background information on logic circuitry, on testing of ICs, and on $I_{DDQ}$-testing in particular.

Sequential Logic

Logic circuitry can be divided into two classes: combinatorial logic circuitry and sequential logic circuitry. A combinatorial logic circuit handles time-independent signal correlations. That is, the logic state and the output signals of a combinatorial logic circuit are solely determined by the instant logic input signals to the circuit. An example of a combinatorial logic circuit is a plurality of interconnected logic gates. A sequential logic circuit, on the other hand, takes history into account. The succession of logic states adopted by a sequential logic circuit is such that a next logic state is determined under combined control of input signals and the circuit's previous logic state. Within this context, a counter, a shift register, a master-slave flipflop and a chain of flipflops are typical examples of a sequential logic circuit.

$I_{DDQ}$-testing

Systematic and automatic testing of electronic circuitry, and of integrated circuits in particular, has become increasingly more important. Each next generation of circuits tends to develop ever larger component densities and an ever growing number of system functionalities. Individual circuits have become complicated to such an extent that process defects cannot be detected and located anymore save by exhaustive and expensive testing. Customers cannot be expected to accept circuitry products that show their hidden defects in operational use, thereby rendering, e.g., life support systems or aircraft control systems, unreliable. It is therefore of the utmost importance for both the manufacturer and the customer that tests are run to guarantee flawless operation of the circuit products.

Quiescent-current testing ($I_{DDQ}$-testing), also referred to as current supply monitoring method (CSM), of an integrated circuit aims at locating process defects in the circuit by monitoring the quiescent currents. The $I_{DDQ}$-testing technique has shown a lot of promise in the analysis of actual process defects in static CMOS ICs. The quiescent current, or steady-state current, in a CMOS logic IC should be very small, e.g., in the order of 1 µA. Any deviation may therefore be easily detected. The potential of this testing technique is substantial in terms of cost reduction, and of quality and reliability enhancement. Stuck-at faults are symptoms caused by unintended electrically conductive interconnections between circuit nodes and supply lines, thereby effecting a hard-wired pull-up or pull-down that interferes with the logic operation. A bridging fault formed by a conductive bridge of low resistance between a supply line and a signal line causes stuck-at phenomena. Impact of gate-oxide defects is often parametric in nature, i.e., not defined in terms of logic voltage levels, and is therefore not detected by conventional voltage methods. Gate-oxide defects may also give rise to stuck-at behaviour.

In "Current vs. Logic Testability of Bridges in Scan Chains", R. Rodríguez-Montanés et al., IEEE Proc. European Test Conf., Rotterdam, The Netherlands, 1993, pp. 392–396, it is pointed out that the $I_{DDQ}$-method does not cover 100% of the low-resistive stuck-at faults (substantially zero resistance connections to the supply lines) in a master-slave flipflop that comprises two memory elements connected via a switch. Therefore, voltage testing, also referred to as logic testing, should be used in addition. Voltage testing monitors the voltage levels at the relevant circuit output nodes and correlates the obtained voltage levels with the desired voltage levels to determine if the circuitry between input and output handles the data properly.

Testing sequential logic circuitry in the conventional manner requires the shuffling of logic data throughout the circuit, typically under clock signal control. This may be quite time-consuming in case of a long scan-chain, as each next stage of the chain will be sensitized only upon the next clock cycle. Testing of each stage requires at least two clock cycles to put the stage successively in each of its logic state plus the time to evaluate the attained logic states per stage. In contrast, testing of combinatorial logic circuitry using the $I_{DDQ}$-method and the voltage testing method combined is highly time-efficient and cost-effective. This stems from the fact that only a few, e.g., typically in the order of ten, different logic input signals (samples) provide good coverage of the logic states to be evaluated for the majority of currently available combinatorial circuits, and from the fact that the delays caused by clock controlled rippling of data through successive stages are completely absent in combinatorial logic circuitry.

OBJECT OF THE INVENTION

It is an object of the invention to simplify testing of sequential circuitry. It is a further object to extend $I_{DDQ}$-testing for detection of low-resistive stuck-at faults in sequential logic circuitry, and for rendering $I_{DDQ}$-testing essentially more effective than in the prior art. It is another object to provide means to execute the testing of sequential logic circuitry substantially faster than is possible in the prior art. It is another object to support modular architecture of circuits.

SUMMARY OF THE INVENTION

To this end, the invention furnishes an electronic device with a plurality of logic circuit stages for functional collaboration, characterized by selection means for selectively operating the plurality of stages to form either a sequential logic circuit or a combinatorial logic circuit.

The inventor has realized that the functionality of a logic circuit, i.e., the sequential or combinatorial functioning, is determined by the manner in which the logic circuit stages collaborate with one another, more than by the specific type of logic operation performed by the individual stage. That is, a collection of logic circuit stages hooked up in one way will function as a sequential logic circuit under application of proper signals, whereas it will operate as a combinatorial logic circuit when interconnected in another way.

The invention is particularly important if the electronic device in operational use is a sequential logic circuit. For the purpose of testing, the invention enables the architecture to be converted into that of a combinatorial logic circuit. As mentioned earlier, running a test on combinatorial logic circuitry to detect certain defects is considerably simpler than testing sequential logic circuitry to detect the same defects. Only a few samples need to be supplied to the circuit in the test mode, i.e., the combinatorial mode, for carrying out the voltage testing, as has been mentioned above. The low-resistive stuck-at faults are easily detected in the test mode, because the combinatorial mode now gives rise to mutually competing, i.e., current-sinking versus current-sourcing, stages that in the sequential mode were operating functionally separated in time.

The invention is typically useful in testing scan-chains comprising a plurality of cascaded memory elements such as flipflops. Such scan-chains or scan paths themselves are used, for example, to economically test other circuitry. The invention is applicable to sequential circuitry in general, to integrated circuits and to systems of integrated circuits. The invention is particularly advantageous when applied to CMOS sequential circuits. The quiescent current in a CMOS logic circuit should be substantially zero. Any deviation is easily detected as the reference of zero current is well defined.

Another advantage of the invention is that the same electronic device can be used for either sequential or combinatorial logic operation in operational use under selective control, thereby supporting modular system-architecture.

For the purpose of testing, the selection means is suitable for reversible selection. The circuitry that is intended to function sequentially in operational use, is temporarily converted to operate in the combinatorial mode. Preferably, the selection means is controllable by a selection signal. This allows for automatic test procedures. In addition, the selection signal can be used in operational use to permit fully automatic switching between sequential and combinatorial operating modes. Preferably, the selection means is user-controllable. This can be brought about by providing the electronic device with an externally accessible control input to receive the selection signal for the selection means.

A data path through sequential logic circuitry, such as a concatenation of latches, can be tested in two directions upon converting the circuitry into combinatorial logic circuitry. The creation of this bi-directional data path allows for detection of stuck-at faults at the output of any of the inverters making up the latches. Preferably, the sequential logic circuitry is coupled between bi-directional buffers in order to permit this bi-directional testing.

Changing from sequential into combinatorial and back again can be brought about in a variety of manners. The device may have a signal path with a particular one of the logic stages arranged between first and second switches. The selection means then is operative to control the first and second switches either mutually complementarily to avoid the switches conducting simultaneously, or uniformly to have the switches both conducting at least part time. The former option implements the sequential mode, the latter the combinatorial mode. Alternatively, the device of the invention may be provided with clock signal means for supplying first and second clock signals to first and second ones of the logic stages, respectively. The selection means then has clock supervising means for governing the clock signal means to provide the first and second clock signals for enabling the first and second logic stages either alternately to implement the sequential mode, or simultaneously at least part time to implement the combinatorial mode. It can be that the clock supervising means governs the clock signal means in the combinatorial mode to furnish the first and second clock signals having synchronously occurring enabling values, or to supply a constant logic level signal to at least the first logic stage to enable the stages simultaneously at least part time.

It is clear to the skilled person that a method of testing an electronic device, provided with a sequential logic circuit, by converting the sequential logic circuit reversibly and functionally into a combinatorial logic circuit, and conducting the testing on the combinatorial circuit, is highly attractive to IC manufacturers. The costs involved in testing represent an increasingly substantial part of the IC's net sales price, as the circuit's complexity grows. The invention extends in particular the domain of applicability of the $I_{DDQ}$-test, thereby permitting a closer monitoring of the reliability of the ICs at costs substantially lower than were attainable heretofore.

For the sake of completeness, it is observed that PLD devices are known provided with configurable macrocells. See, for example, PL22V10 in Philips Data Handbook IC13, "Programmable Logic Devices (PLD), 1992, pp. 137–141. The macrocell can be programmed to fulfill registered operations or combinatorial operations. The combinatorial option uses a bypass to functionally remove the cell's flipflop from the cell. In the invention, however, the logic stages necessarily remain functional parts of the logic circuit so as to allow for testing.

BRIEF DESCRIPTION OF THE DRAWING

The invention is explained below by way of example and with reference to the accompanying drawing, wherein.

Throughout the figures same reference numerals indicate similar or corresponding features.

DESCRIPTION OF THE PREFERRED EMBODIMENTS

Figure 1:
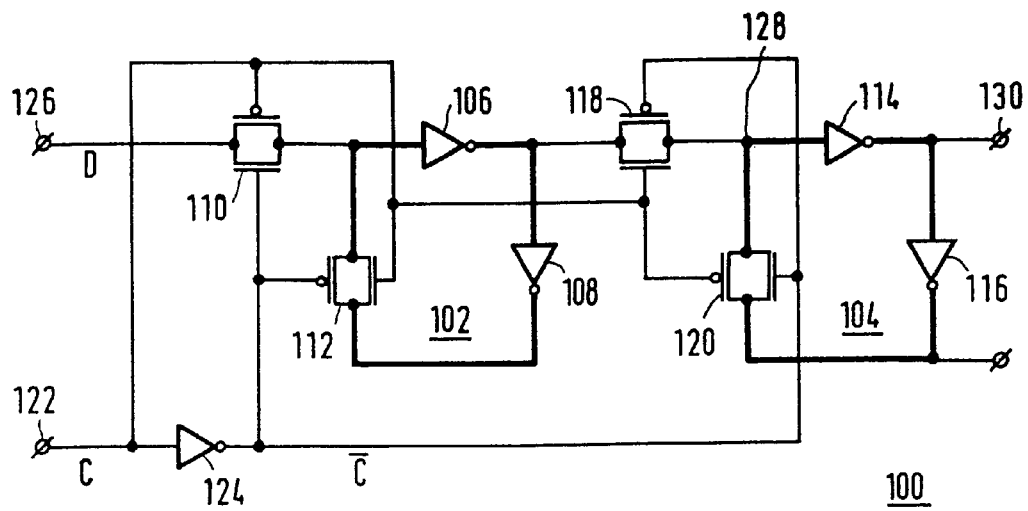
FIG. 1 gives a prior art sequential circuit.

FIG. 1 gives a circuit diagram of a sequential logic circuit 100 known in the art. Circuit 100 is an edge-triggered master-slave flipflop comprising a master latch 102 and a slave latch 104. Master 102 includes inverters 106 and 108 and transmission gate pairs 110 and 112. Slave 104 includes inverters 114 and 116, and transmission gate pairs 118 and 120. Each of transmission gate pairs 110, 112, 118 and 120 comprises an NFET and a PFET, whose conduction channels are arranged in parallel, and whose control electrodes receive complementary clock signals C and CBAR provided via a clock input 122 and an inverter 124. Pairs 110, 112, 118 and 120 operate as switches. When pair 110 is conducting, pair 112 is blocked and vice versa. Similarly, when pair 118 is conductive, pair 120 is blocked and vice versa. The clock signals are supplied in such a way that pairs 110 and 118 conduct alternately.

When the clock signal at clock input 122 is low, pairs 110 and 120 are conducting while pairs 112 and 118 are blocked. Data at data input 126 then is transferred to inverter 106 that in turn supplies the inverted data to inverter 108. Thus, master 102 accepts the data provided at input 126. At the same time, slave 104 retains its stored data as inverters 114 and 116 now form a bistable element, being disconnected from master 102. When the clock signal at clock input 122 goes high, pair 110 becomes non-conducting and master 102 no longer accepts data from input 126. At the same time, pair 112 becomes conductive so that inverters 106 and 108 form a bistable element storing the previously accepted data. Also, pair 120 in slave 104 is blocked and pair 118 becomes conductive, thereby rendering slave 104 receptive to the data stored in master 102. The blocking of pair 120 allows inverter 106 to have a relatively weak driving capability, since there is no competition with inverter 116.

Now assume that a low-resistive stuck-at fault causes node 128 in slave 104 to be permanently connected to one of supply voltages $V_{DD}$ and $V_{SS}$. The driving capability of the hard short to one of the supply voltages is much larger than that of inverter 106. Consequently, the low-resistive hard short causes master 102 to be overwritten. The time it takes to overwrite master 102 depends on the relative strengths of the short and inverter 106. However, the overwriting will typically be accomplished in too short a time period to be detected through $I_{DDQ}$-testing. Referring to the voltage testing method mentioned above, note that circuit 100 requires a full clock cycle to transfer the input data at input 126 of master 102 to an output 130 of slave 104. A chain of a plurality of N flipflops connected in cascade therefore needs N clock cycles to make the data available at the output of the chain.

Principle

Figure 2:
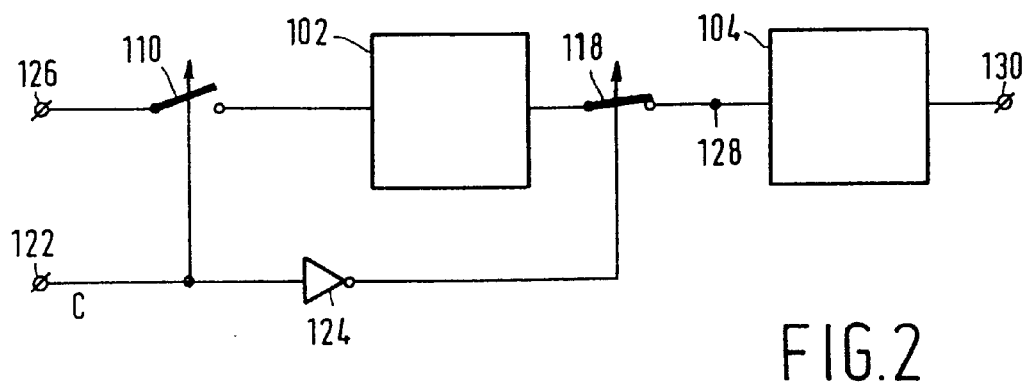
FIGS. 2 and 3 illustrate the principle in the invention.
Figure 3:
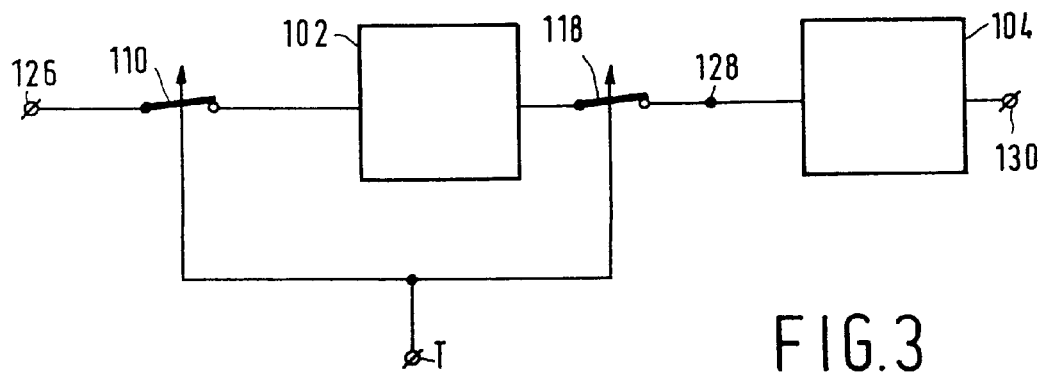

Referring to FIGS. 2 and 3, the principle of the invention is now explained. Details being trimmed away, the diagram of FIG. 2 illustrates the prior art circuit of FIG. 1 in terms of its functionalities. Effectively, master-slave flipflop 100 comprises a master latch 102 and a slave latch 104 arranged in cascade and alternately made accessible under control of switches 110 and 118. If one of switches 110 and 118 conducts, the other is blocked and vice versa. The circuit thus operates in a sequential mode.

The diagram of FIG. 3 gives the same collection of functional blocks as in FIG. 2, but the operation of switches 110 and 118 is modified so that both are made simultaneously conductive, e.g., under control of a modified clock signal here indicated by capital letter "T". The circuit's operation now is combinatorial, the complementary clocking of segments in the signal path between input 126 and output 130 being removed. The output voltage at a particular moment is determined by the input voltage at the same instant, the usual propagation delays being left out of consideration here. A stuck-at fault at node 128 will become immediately clear in the $I_{DDQ}$-test because of a driven conflict between the data input being kept at a predetermined level and the hard short at node 128.

Master latch 102 and slave latch 104 are coupled through switch 118. Implemented as a transmission gate made up of complementarily controlled FETs, switch 118 is bi-directional. When both master 102 and slave 104 are active, i.e., when flipflop 100 is put into the combinatorial mode, some type of defects in slave 104 may overwrite master 102. This type of defect could then be rendered not detectable. If switch 118 is made uni-directional, no overwriting of master 102 by slave 104 can occur, and consequently, the defect that was formerly not detectable, can be detected by $I_{DDQ}$-measurements. The uni-directional character could be implemented by, e.g., putting an additional inverter between master 102 and transmission gate 118.

First Example

Figure 4:
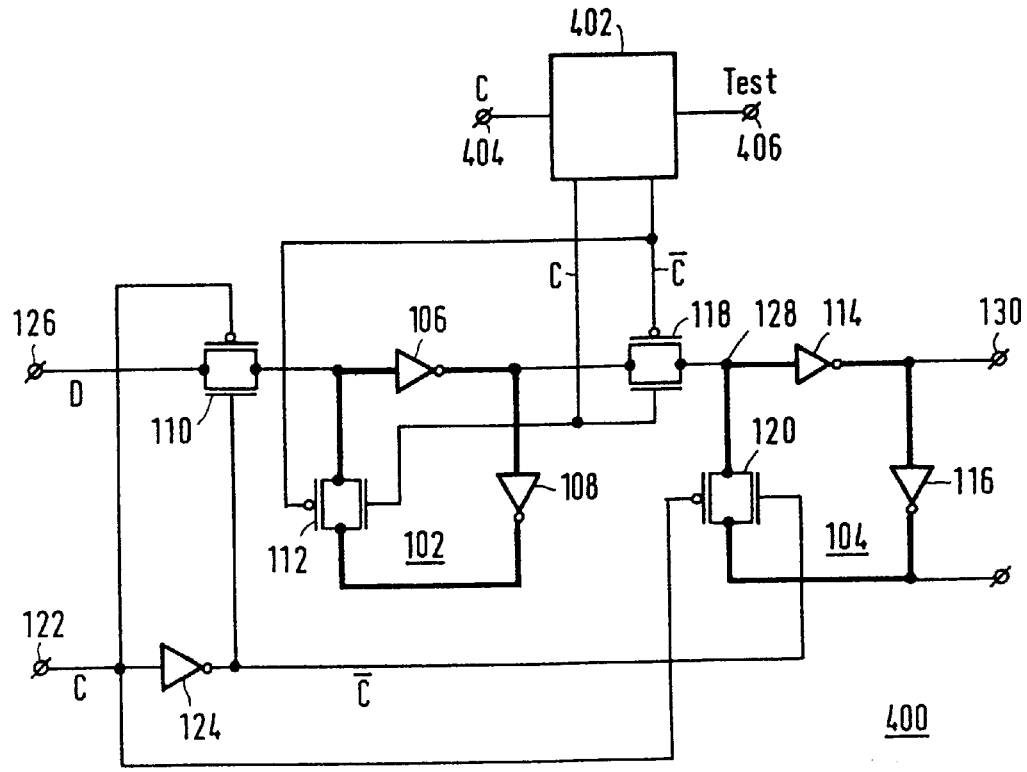
FIGS. 4 and 5 give a first example of a circuit device in the invention.

FIG. 4 gives a first example of a circuit device 400 in the invention. Device 400 functionally comprises the logic stages of the logic circuit as discussed under FIG. 1. Transmission pairs 110 and 120 are controlled in the same way as in FIG. 1. In addition, device 400 has a selection means 402 for reversibly and functionally converting the sequential logic circuit into a combinatorial logic circuit. To this end, selection means 402 has an input 404 for receiving said clock signal C, and a control input 406 for receiving a selection signal "Test". If selection signal "Test" is in a first state, selection means 402 drives transmission pairs 112 and 118 complementarily to pairs 120 and 110, respectively, by supplying clock signals C and CBAR of appropriate polarity. If selection signal "Test" is in a second state, selection means 402 provides signals to pairs 112 and 118 so as to render them conductive at least when pairs 110 and 120 are conductive. This can be achieved, e.g., by either making at least one of the signals C and CBAR static and of an appropriate fixed voltage, or by providing dynamic signals C and CBAR whose enabling-level voltages occur synchronously and in-phase with the clock signals received by pairs 110 and 120.

Figure 5:
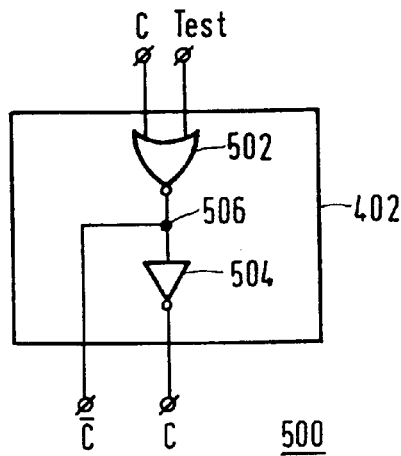

FIG. 5 gives an example of an embodiment 500 of selection means 402. Embodiment 500 includes a cascade arrangement with a NOR gate 502 and an inverter 504. NOR gate 502 receives clock signals C at a first input and selection signal "Test" at a second input. A first output of embodiment 500 is connected to a node 506 between NOR gate 502 and inverter 504. A second output of embodiment 500 is connected to the output of inverter 504. If "Test" is low, selection means 402 operates circuit 400 in the sequential mode by furnishing the proper clock signals C and CBAR. If "Test" is high, selection means 402 supplies a static logic low at its first output and a static logic high at its second output. This renders circuit 400 operating in the combinatorial mode.

If there is a hard short to $V_{DD}$ at node 128, and data at input 126 is kept high, i.e., at $V_{DD}$, inverter 106 and the hard short at node 128 compete with one another: inverter 106 pulls node 128 down by sinking current, and the short at node 128 pulls node 128 up by sourcing current. There is no overwriting of master portion 102 as input 126 is kept high. Accordingly, the result is a substantial quiescent current that is detectable in the $I_{DDQ}$-test.

As is clear, a variant of this scheme can be applied on pair 110 instead of on pair 118. A similar concept can be applied to a two-phase level-sensitive flipflops. The cost of this local implementation is an additional six transistors and test signal routing to each relevant flipflop.

Second Example

Figure 6:
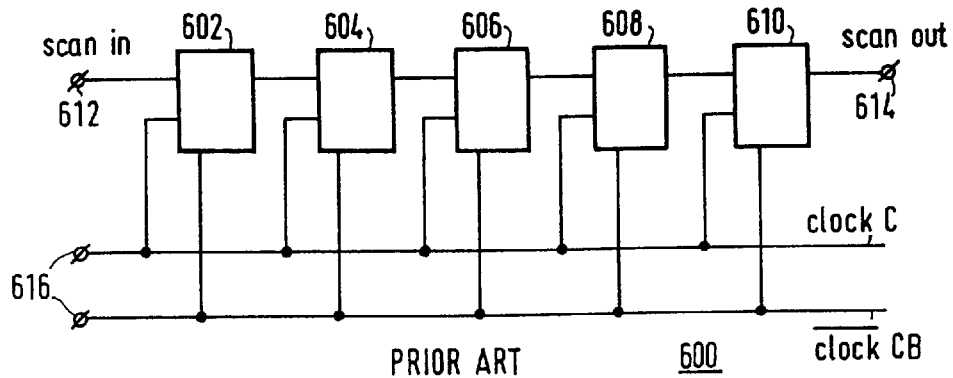
FIG. 6 shows a conventional scan chain.

FIG. 6 shows a conventional scan chain 600 comprised of a plurality of flipflops 602, 604, 606, 608 and 610, that are arranged in a cascade between a scan input 612 and a scan output 614. Data at scan input 612 are sequentially clocked through the plurality of flipflops 602–610 to scan output 614 under clock signal control at clock input 616. As is clear, scan chain 600 operates in a sequential mode.

Figure 7:
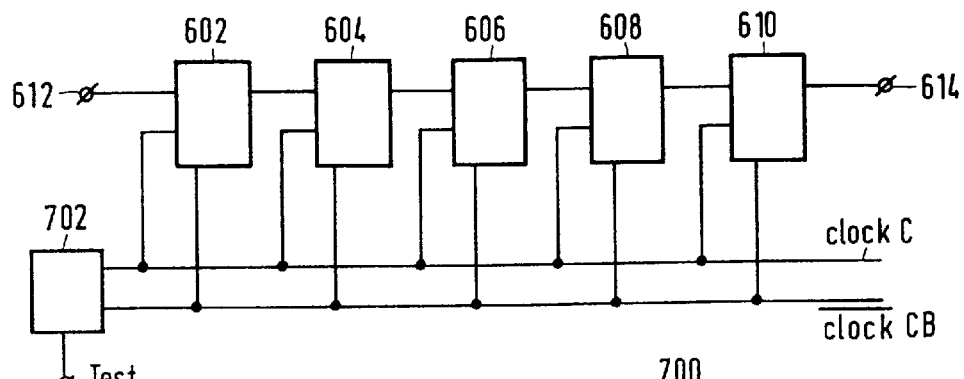
FIG. 7 gives a second example of a device in the invention with regard to a scan chain.

FIG. 7 shows a similar chain 700, now according to the invention and provided with a selection means 702 functionally merged with the clock signal means. Selection means 702 has an input 704 for receiving a selection signal "Test" to provide either single-phase mutually complementary clock signals C and CB, or a clock signal C and a fixed-level voltage signal CB, e.g., a logic high or a logic low. In the latter case, the chain is made transparent to the data in order to be submitted to the testing as discussed with reference to the first example. As there is a cascade of only inverter pairs present between input 612 and output 614, the circuit is purely combinatorial and can, in addition, be tested in the voltage test method with just two test samples, namely a logic low and a logic high at input 612. Basically, there is provided a control of transmission gates 112 and 118 independent of the control of gates 110 and 120.

Figure 8:
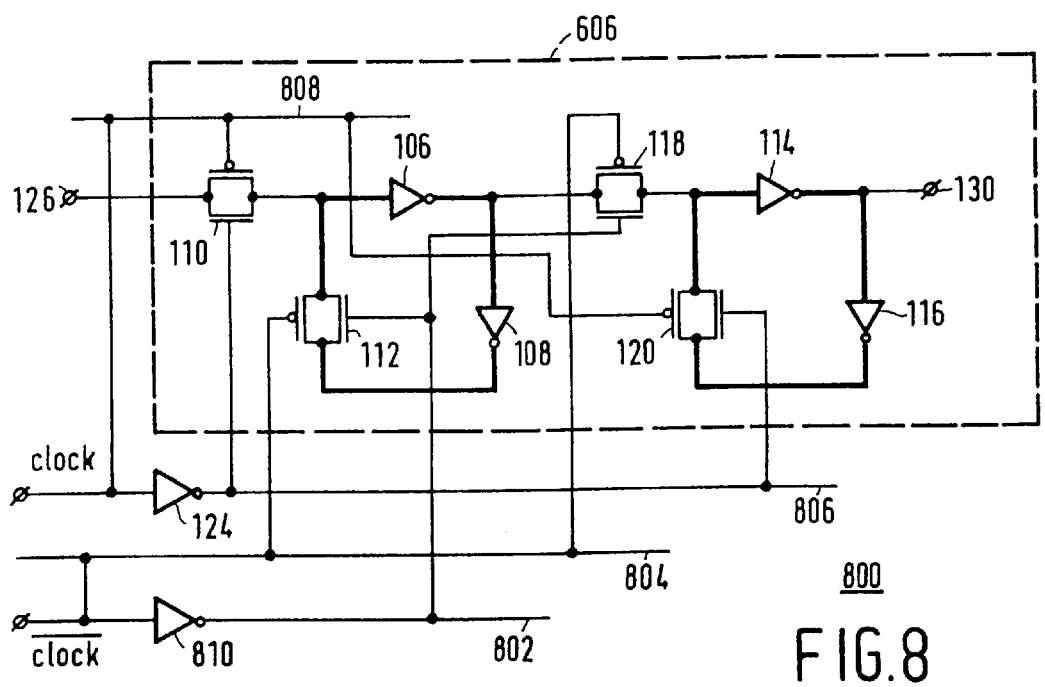
FIG. 8 gives a detailed embodiment of the circuit in FIG. 7.

FIG. 8 gives a detailed example 800 of the interconnections in flipflop 606 to clocking lines 802, 804, 806 and 808 common to the plurality of flipflops 602–610 in chain 700. Now, costs are cut drastically with regard to the example of FIG. 4. In the latter, each sequential logic circuit, i.e., each flipflop, is provided with a selection means. In FIG. 8, on the other hand, the selection means is modified to be functionally integrated with the clock signal means at the expense of an additional inverter 810 per flipflop.

Third Example

The invention is particularly advantageous to test scan paths that comprise a concatenation of flipflops as discussed above with reference to FIGS. 6–8. The testing of scan paths is considered in further detail below.

Figure 9:
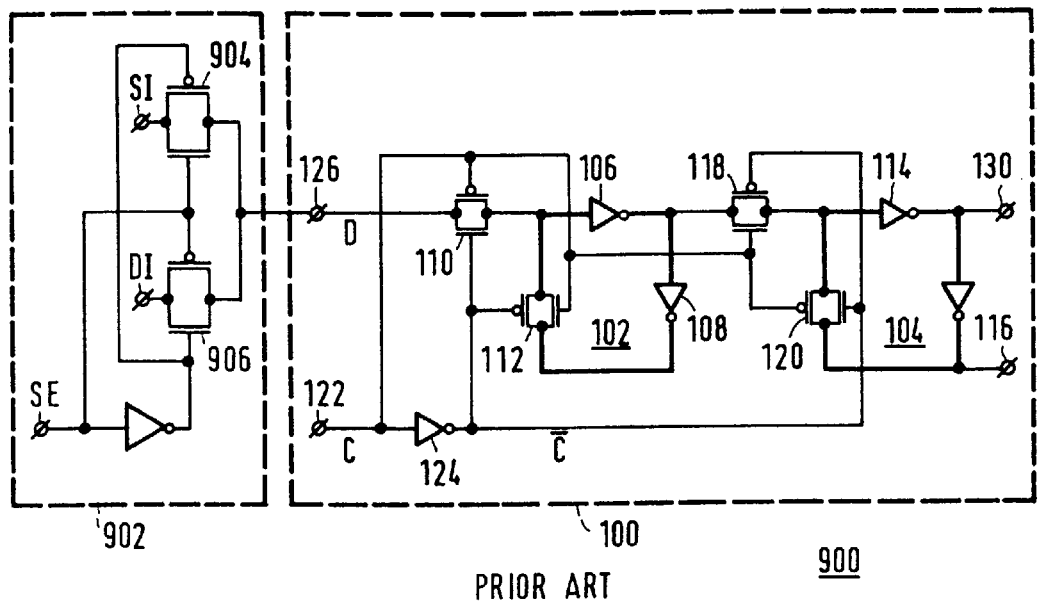
FIG. 9 is a prior art scan flipflop for use in a scan path.

FIG. 9 is a typical example of a prior art scan flipflop 900 for use in a scan chain and comprises flipflop 100 of FIG. 1 and a 2-to-1 multiplexer 902 connected to input 126. Multiplexer 902 is comprised of transmission gate pairs 904 and 906 for selecting between normal data DI and scan data SI under control of a control signal SE.

Figure 10:
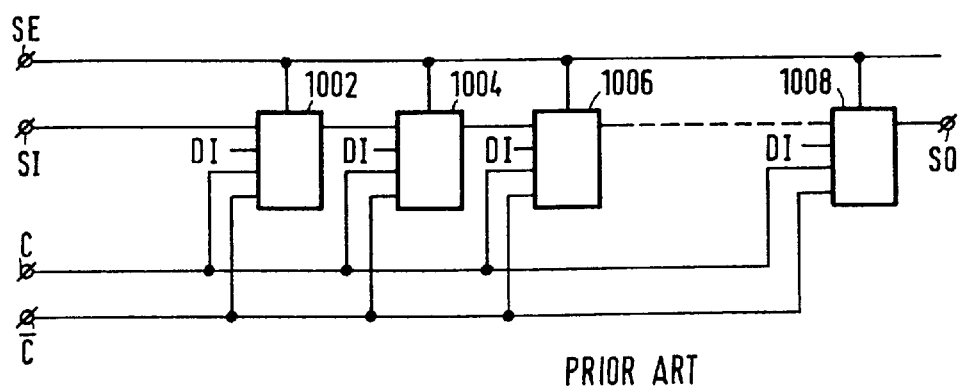
FIG. 10 is a prior art scan path.

FIG. 10 shows a prior art scan path with a plurality of flipflops 1002, 1004, 1006, . . . , 1008, each similar to flipflop 9000 of FIG. 9, that are arranged between a scan-in input SI and a scan-out output SO. Flipflops 1002–1008 receive aforesaid control signal SE, clock signal C and clock signal CBAR in parallel.

Figure 11:
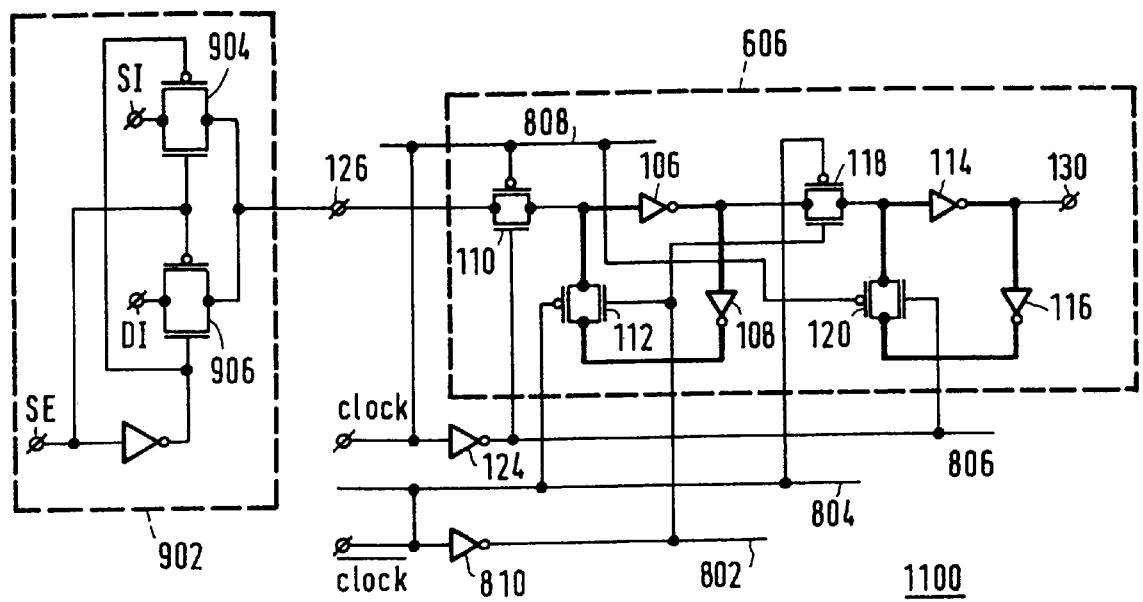
FIG. 11 gives a detailed scan flipflop according to the invention.

FIG. 11 is a diagram of a scan flipflop 1100 in accordance with the invention. Flipflop 1100 comprises a 2-to-1 multiplexer 902, similar to the one discussed under FIG. 9. Block 606 corresponds to the device discussed under FIG. 8 above. Operation is explained with reference to FIG. 12.

Figure 12:
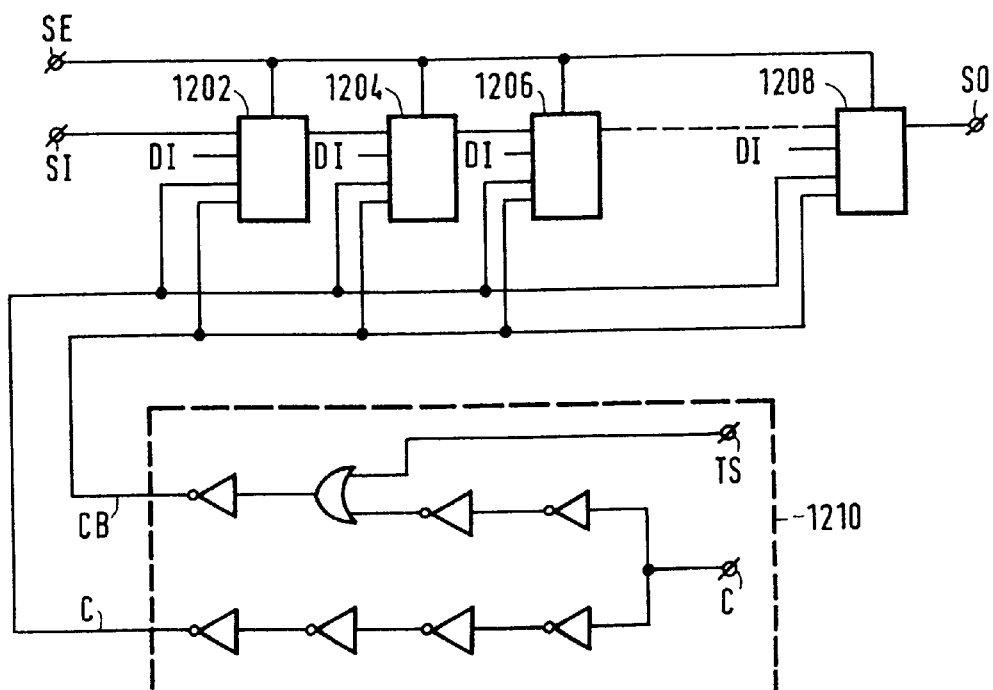
FIG. 12 is a detailed scan path according to the invention

FIG. 12 shows a first example of a scan path 1200 that comprises a plurality of scan flipflops 1202, 1204, 1206, . . . , 1208 of the type shown in FIG. 11 to allow for testing of the path itself. Scan path 1200 is conceptually similar to chain 700 discussed above. The path is controlled via a clock generator 1210 that receives a control signal TS to control the transparency of the scan path and a clock signal C. Selection between normal mode and scan mode is accomplished through control signal SE. When both signal TS and SE are low and the clock is active, the path operates in the normal mode. When signal SE is high, the scan mode is implemented. In both the normal mode and the scan modes flipflops 1202–1208 receive complementary clock signals and form a sequential logic circuit. When both signals TS and SE are made high and when the clock is disabled at a low, the path is made transparent as explained under FIG. 8 above, thus implementing the test mode. At the expense of an additional inverter 810 per scan flipflop and additional routing of the clock signals this scan path implementation is rendered testable in a rather simple way.

However, it would be still more attractive to have the amount of hardware reduced that is needed to allow for the testing in conformity with this invention.

Figure 13:
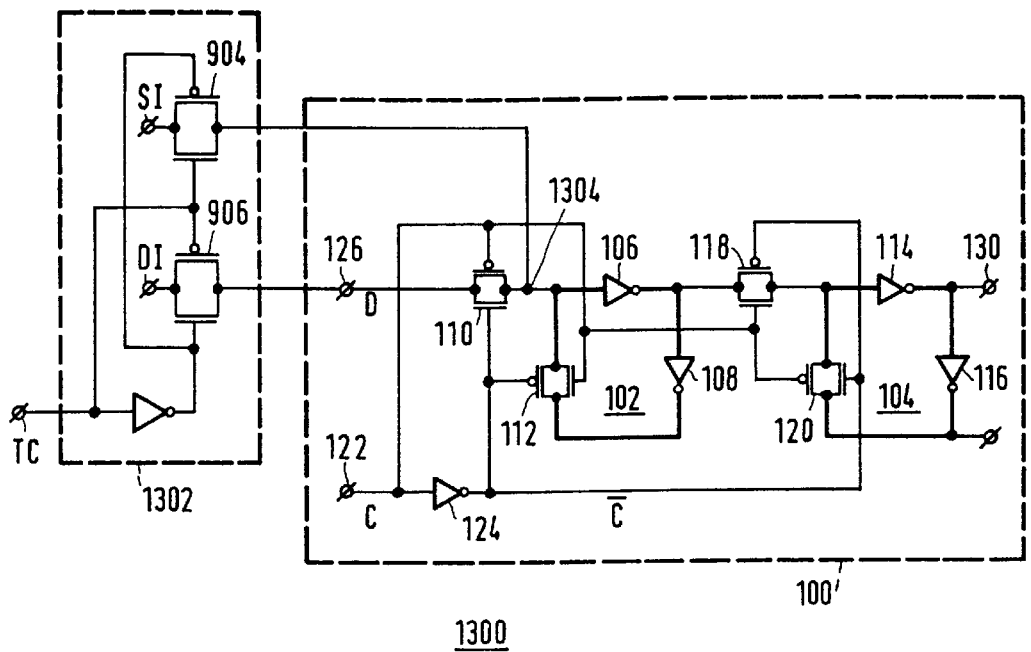
FIG. 13 is another detailed scan flipflop according to the invention.

FIG. 13 is a scan flipflop 1300 in accordance with the invention for use in a scan path wherein the testing hardware is reduced. Scan flipflop 1300 is made up of device 100, discussed under FIG. 1, and a routing device 1302 containing a pair of complementarily controlled transmission gates 904, 906 for under control of a signal TC either transferring data present at input DI or scan data present at input SI. Routing device 1302 uses the same components as multiplexer 902 in FIG. 11. However, gates 904 and 906 in routing device 1302 are not connected to the same node as in the multiplexer scheme. Gate 904 couples input signal SI to a node 1304 between gate 110 and inverter 106 under control of a control signal TC, thereby selectively shunting gate 110. Gate 906 couples input signal DI to input 126 of device 100 under control of control signal TC. Note that this implementation has the same and the same number of components as prior art flipflop 900, and requires only some re-routing of the signals with regard to multiplexer 902 of prior art flipflop 900.

The normal mode data path of flipflop 1300 is not changed and is the same as in flipflop 900. Accordingly, the normal mode set-up and hold times are not affected. Furthermore, the clock paths of the flipflop is not changed either so that the normal mode of operation remains unaffected. Operation is explained with reference to FIG. 14.

Figure 14:
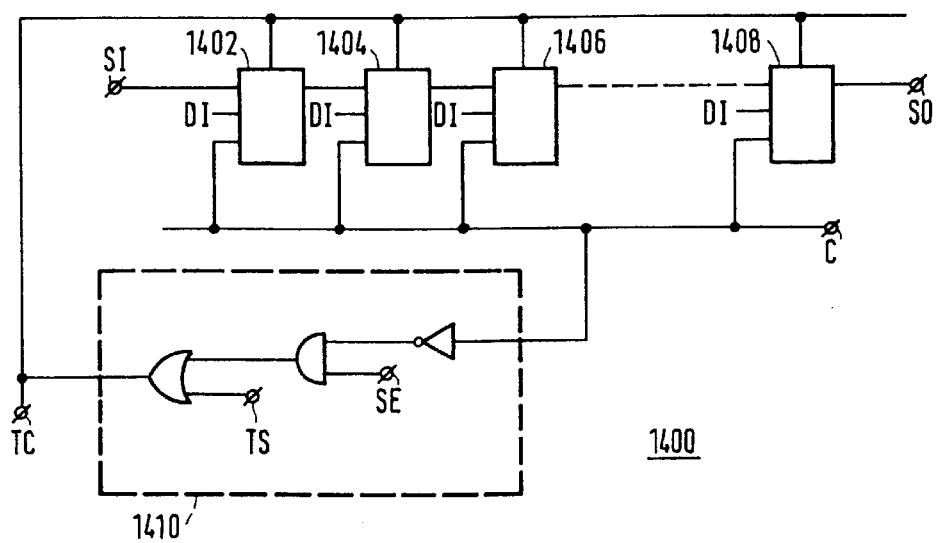
FIG. 14 is a detailed further scan path according to the invention.

FIG. 14 is a further example of a scan path 1400 in accordance with the invention wherein the amount of hardware is reduced. Scan path 1400 employs as building blocks scan flipflops of the type 1300 shown in FIG. 13, requiring no additional logic gates in contrast with scan path 1200. Further, the additional routing of the clock signals in scan path 1200 is eliminated in scan path 1400. Scan path 1400 comprises a plurality of scan flipflops 1402, 1404, 1406, . . . , 1408, all of the type shown in FIG. 13, and a scan controller 1410. Scan controller 1410 controls the modes of operation of flipflops 1402–1408. Scan controller 1410 generates an output signal TC that can be controlled asynchronously at logic high as well as at logic low. Moreover, it can act as the clock signal dependent on the input decoding conditions, determined by clock signal C, control signal SE and control signal TS. Selection between normal mode and scan mode is accomplished through control signal SE. Control signal TS controls the transparency of the scan path. If TS and SE are logic low and the clock is active (toggles), then TC is logic low and the scan path operates in the normal mode. If TS is low, and if SE is high and the clock toggles, then TC is logic high and the scan mode is selected. If TS is high, and if SE is low and if the clock is kept at logic high, the test mode is selected, rendering all flipflops 1402–1408 transparent for $I_{DDQ}$-testing. The clock is to be kept at logic high to maintain transmission gates 112 and 118 conductive.

What is claimed is:

1. An electronic device with a plurality of logic stages for functional collaboration, said plurality of logic stages comprising a sequential logic circuit for operation in a normal operating mode, and selection means for selectively and reversibly converting said plurality of logic stages of said sequential logic circuit to a combinatorial logic circuit comprising all of said logic stages in a test mode, said selection means comprising a selection input for receiving a selection signal for controlling said converting and a selection circuit having an input coupled to said selection input and an output coupled to said logic stages for selectively and reversibly converting all of said stages to said combinatorial logic circuit to test said stages in said test mode.

2. The device of claim 1, having a signal path with a particular one of the logic stages arranged between first and second switches, wherein the selection means are operative to control the first and second switches either mutually complementarily to avoid the switches conducting simultaneously, or uniformly to have the switches both conducting at least part time.

3. The device of claim 1, with clock signal means for supplying first and second clock signals to first and second ones of the logic stages, respectively, wherein the selection means has a clock supervising means for governing the clock signal means to provide the first and second clock signals for enabling the first and second logic stages either alternately or simultaneously at least part time.

4. The device of claim 3, wherein the clock supervising means are operative to govern the clock signal means to furnish a constant logic level signal to at least the first logic stage for implementing the at least part time simultaneous enabling.

5. The device of claim 1, wherein the logic stages form a scan path, each respective one of the logic stages comprising:

a respective scan flipflop having a master part with clock controlled master transmission gates and having a slave part with clock controlled slave transmission gates; and a respective data routing device connected to the respective scan flipflop for under control of a control signal either coupling a data input to an input of the slave of the respective flipflop, or coupling a scan input to a node between the slave transmission gates.

6. The device of claim 1, wherein the logic stages are coupled between bi-directional buffers.

7. A method of testing an electronic device provided with a sequential logic circuit having a plurality of logic stages, characterized in that the method comprises:

converting the sequential logic circuit reversibly and functionally into a combinatorial logic circuit comprising all of said logic stages; and conducting the testing on the combinatorial circuit.

* * * * *